(12) United States Patent
Kim et al.

(10) Patent No.: US 8,367,302 B2
(45) Date of Patent: Feb. 5, 2013

(54) METHOD AND APPARATUS FOR MANUFACTURING SEMICONDUCTOR DEVICE

(75) Inventors: Hak Joon Kim, Icheon-si (KR); Jun Hyung Park, Suwon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/985,648

(22) Filed: Jan. 6, 2011

(65) Prior Publication Data

US 2011/0151382 A1  Jun. 23, 2011

Related U.S. Application Data

(62) Division of application No. 11/936,224, filed on Nov. 7, 2007, now Pat. No. 7,887,323.

(30) Foreign Application Priority Data

Jun. 29, 2007 (KR) .................. 10-2007-0065546

(51) Int. Cl.
*G03F 7/26* (2006.01)
(52) U.S. Cl. ....................................... 430/311; 430/330

(58) Field of Classification Search .................. 430/311, 430/327, 322, 330, 348
See application file for complete search history.

(56) References Cited

U.S. PATENT DOCUMENTS

| | | | |
|---|---|---|---|
| 6,720,115 B2 * | 4/2004 | Inao et al. | 430/5 |
| 2001/0031122 A1 * | 10/2001 | Lackritz et al. | 385/131 |
| 2005/0106512 A1 * | 5/2005 | Endo et al. | 430/495.1 |

FOREIGN PATENT DOCUMENTS

| KR | 1020000027398 | 5/2000 |
|---|---|---|
| KR | 1020060120427 | 11/2006 |

* cited by examiner

*Primary Examiner* — Kathleen Duda
*Assistant Examiner* — Caleen Sullivan
(74) *Attorney, Agent, or Firm* — IP & T Group LLP

(57) ABSTRACT

A method and apparatus for manufacturing a semiconductor device is disclosed. In particular, the application discloses a method that performs a lithography process using a material capable of increasing a depth of focus so as to prevent efficiency of the lithography process from being degraded due to high integration of a semiconductor device, and a pressure-type bake oven as an apparatus for forming a high refractive material on a semiconductor substrate, having advantages of reducing manufacturing costs of a semiconductor manufacturing process and increasing efficiency of the lithography process.

7 Claims, 6 Drawing Sheets

METHOD AND APPARATUS FOR MANUFACTURING SEMICONDUCTOR DEVICE

This application is a division of U.S. patent application Ser. No. 11/936,224 filed on Nov. 7, 2007 and issued on Feb. 15, 2011 as U.S. Pat. No. 7,887,323, which claims the benefit of priority to Korean Patent Application No. 10-2007-0065546, filed on Jun. 29, 2007, the entire contents of which are incorporated herein by reference.

TECHNICAL FIELD

The invention relates to a method and apparatus for manufacturing a semiconductor device. In particular, the invention relates to a method that performs a lithography process using a high refractive material capable of increasing a depth of focus so as to prevent the efficiency of the lithography process from being degraded due to high integration of a semiconductor device, and using a pressure-type bake oven as an apparatus for forming a high refractive material on a semiconductor substrate. The invention has the advantages of reducing manufacturing costs of a semiconductor manufacturing process and increasing efficiency of the lithography process.

BACKGROUND

As the integration of a semiconductor device becomes higher, the size of the semiconductor device is reduced, and as a result, a lithography process that is used to manufacture the semiconductor device becomes more complicated. At present, as an exposure wavelength when a pattern of dense lines or a single line is formed, a wavelength of 248 nm or 193 nm is mainly used. Recently, patterning that uses a wavelength of 157 nm is gradually being used.

When the shorter wavelength is used, if the structure of a thin film, such as a photoresist, which is formed on a semiconductor substrate, is slightly changed, the resolution and depth of focus (DOF) are decreased. Accordingly, the pattern may be distorted and Line Edge Roughness (LER) may occur.

In a general lithography process, the structure of the photoresist is primarily changed during a bake process.

FIG. 1 is a cross-sectional view showing a bake oven according to the related art.

Referring to FIG. 1, the bake oven includes a heating plate 10. Heat rays 20 are provided at an upper portion inside the heating plate 10 to heat a wafer 30, and an exhaust pipe 70, through which a gas 60 is ejected, is provided at an edge of the heating plate 10.

A cover 40 is provided above the plate 10, and gas ejection nozzles 50 are provided inside the cover 40.

If the wafer 30 is heated using the heat rays 20, it does not heat uniformly over the entire surface. Accordingly, during the bake process, the gas 60 is ejected on the surface of the wafer 30 to disperse the heat.

When the thin film is formed in such a manner, during the bake process, the molecular weight of the thin film is increased by geometric progression, and the thickness of the thin film is unnecessarily increased. Accordingly, the depth of focus (DOF) is changed during an exposure process. As a result, costs for the lithography process are increased, and the efficiency of the semiconductor manufacturing process is reduced.

SUMMARY

Embodiments consistent with the invention are directed to a method of manufacturing a semiconductor device. The method includes forming a thin film for a mask pattern on a semiconductor substrate, applying pressure to the thin film so as to improve the density and refractive index of the thin film and performing a lithography process on the thin film to obtain the mask pattern.

The thin film may be a photochemical thin film. The pressure may be applied by pressurizing a gas into a bake apparatus. The temperature when the gas is injected is preferably in the range of about 100° C. to 300° C., and more preferably, in the range of about 170° C. to 220° C. Further, the pressure may be applied by irradiating an ultraviolet ray or an electron beam onto the thin film. In addition, the pressure may be applied by applying a physical force to the thin film. The pressure may be in the range of about 10 psi to 100 psi. The lithography process may be an immersion lithography process.

According to another embodiment of the invention, there is provided an apparatus for manufacturing a semiconductor device. The apparatus includes a heating plate for a bake oven that heats a wafer, a bake oven cover that covers the heating plate, gas nozzles that providing a gas into the bake oven cover and pressure pumps for pressuring the gas provided into the gas nozzles.

The heating plate may be an indirect heating-type plate. The gas may be one of nitrogen, helium, argon, and a mixed gas thereof. A primary and a secondary pressure pump are provided for increasing the pressure. Temperature control units are provided among the bake oven cover, the primary pressure pump, and the secondary pressure pump, respectively. Preferably, when the gas is injected, the temperature control unit preferably controls a temperature to be in the range of about 100° C. to 300° C. More preferably, when the gas is injected, the temperature control unit controls a temperature to be in the range of about 170° C. to 220° C. The pressure in the bake oven may be in the range of about 10 psi to 100 psi.

DETAILED DESCRIPTION

Hereinafter, a method and apparatus for manufacturing a semiconductor device according to an embodiment of the invention will be described in detail with reference to the accompanying drawings.

Figure 1:
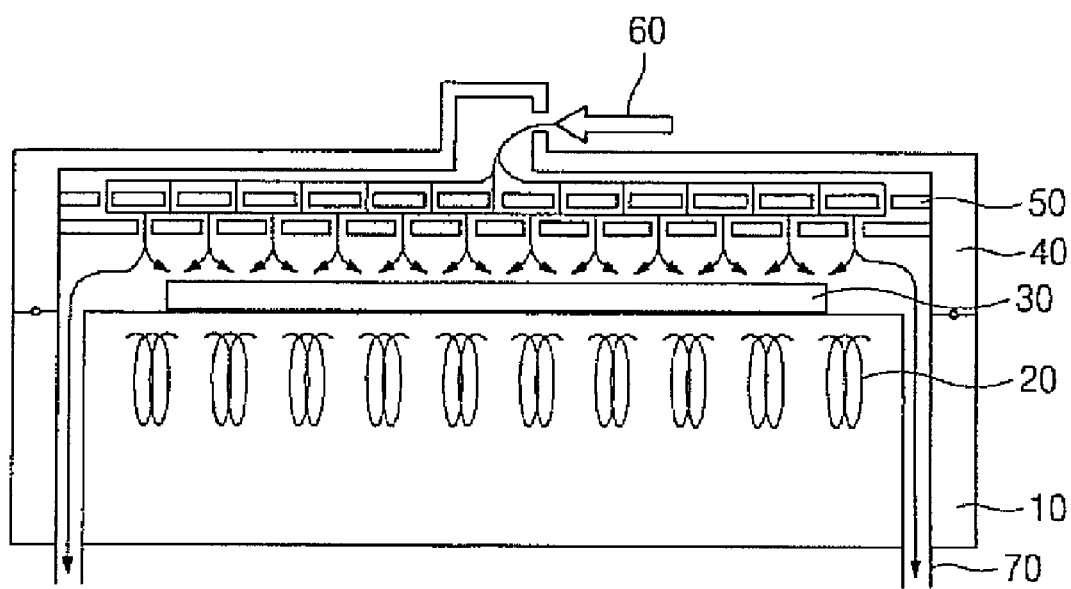
FIG. 1 is a cross-sectional view showing a bake oven according to the related art.
Figure 2:
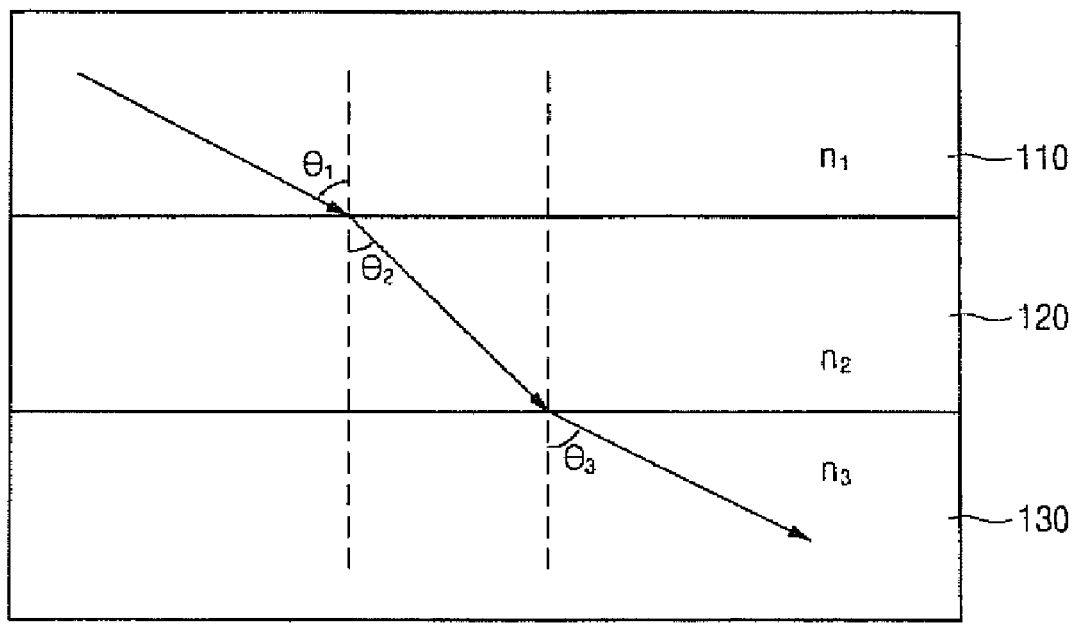
FIG. 2 is a conceptual view illustrating Snell's law regarding light refraction at a boundary of two mediums having different densities according to one exemplary embodiment.

FIG. 2 is a conceptual view illustrating Snell's law regarding light refraction at a boundary of two mediums having different densities.

Referring to FIG. 2, when the refractive index of a first medium is n1, the refractive index of a second medium is n2, the refractive index of a third medium is n3, and angles between light incident on the individual mediums and perpendiculars with respect to individual interfaces between the mediums are θ1, θ2, and θ3, Snell's law is as follows:

When $n1<n2, \theta1>\theta2$ (1)

When $n_2>n_3, \theta_2<\theta_3$ (2)

That is, when light is incident from the first medium on the second medium, reflection and refraction of light occur at the interface. At this time, when an angle between the perpendicular of the interface and an incident light beam is $\theta_a$, and a reflection angle and a refraction angle are $\theta_r$ and $\theta_b$, the law of reflection and the law of refraction can be obtained as follows according to Huygens' principle:

Law of Reflection

θa=θr (The reflection angle θr is equal to the incident angle θa. This relationship is constantly established regardless of the light wavelength and the types of the two mediums.)

Law of Refraction

When light is incident on a medium a at an angle of θo in a vacuum, if the refractive index of the medium a is na, the following expression is established:

$\sin \theta o / \sin \theta a = na$

This expression is called the law of refraction or Snell's law. Here, if light is incident on a medium b at an angle of θo in a vacuum, when the refractive index of the medium b is nb, the following expression is established:

$\sin \theta o / \sin \theta b = nb$

From this expression, it can be seen that the expression $\sin \theta a / \sin \theta b = nb/na$ is established.

Accordingly, a relative refractive index n(=nb/na) when light is incident from the medium a on the medium b can be obtained. For example, total internal reflection occurs when light is incident from a medium having a high refractive index on a medium having a low refractive index and θb=90° (Sin θb=1). And the following relationship is established:

$\sin \theta a / \sin \theta b = \sin(\theta a = \theta c)/\sin(\theta b = 90°) = \sin \theta c$ If the incident angle θa is equal to or more than the critical angle θc, refracted light disappears, and total internal reflection is made.

Figure 3:
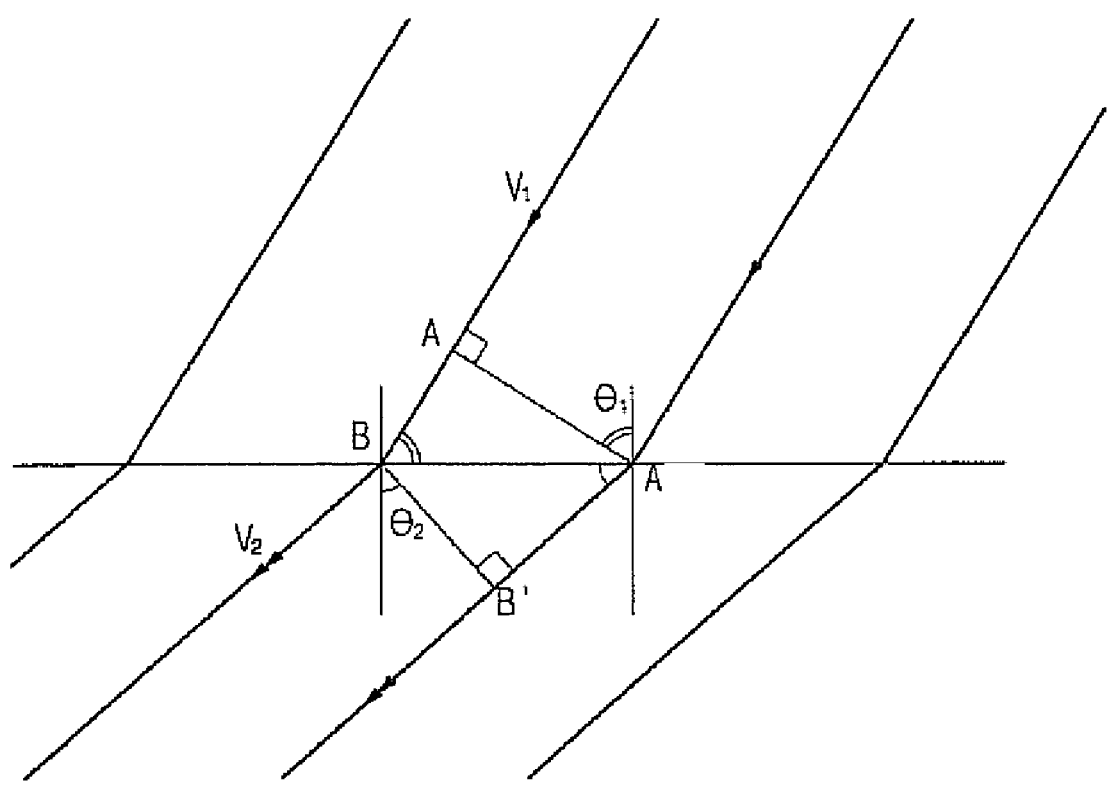
FIG. 3 a graph illustrating refraction of a plane wave according to one exemplary embodiment.

FIG. 3 is a graph showing refraction of a plane wave according to Huygens' principle.

Referring to FIG. 3, it can be seen that, since a traveling wave passes through two mediums having different densities at different velocities, a wavefront BB' has a predetermined slope with respect to a wavefront M'.

Here, when the velocities of the traveling wave in the two mediums are v1 and v2, and the incident angle and the reflection angle are θ1 and θ2, the following relationship is established:

$\sin \theta 1 / \sin \theta 2 = v1/v2$

If the lithography process is performed using a hyper-NA (>1.0) lens according to Snell's law and Huygens' principle, the incident angle is equal to or more than the critical lens in a projection lens. Accordingly, total internal reflection is made in the lens, and light is not transmitted to the lower portion of the lens, such that the lithography process may not be performed. For this reason, an immersion lithography process is performed by disposing water having a density (refractive index) higher than air below the projection lens to reduce a difference in density at the interface, and as a result, the lithography process is performed.

Figure 4A:
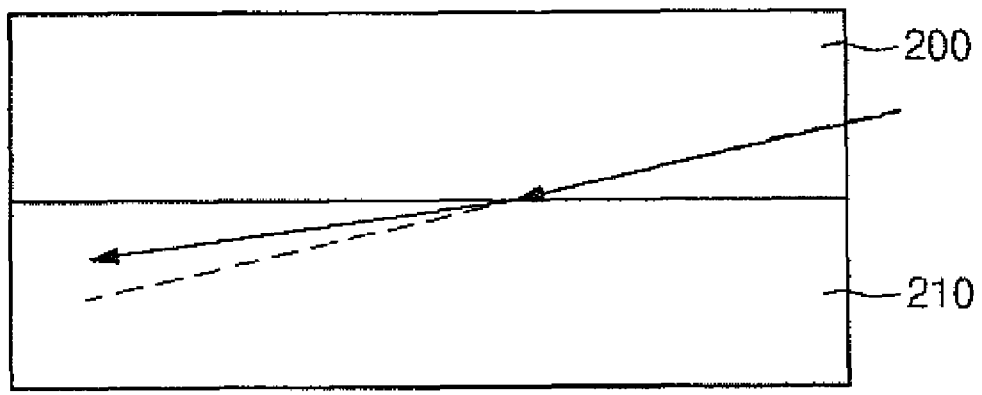
FIGS. 4A and 4B are cross-sectional views showing a difference in light path according to a refractive index of a thin film during an immersion lithography process according to one exemplary embodiment.
Figure 4B:
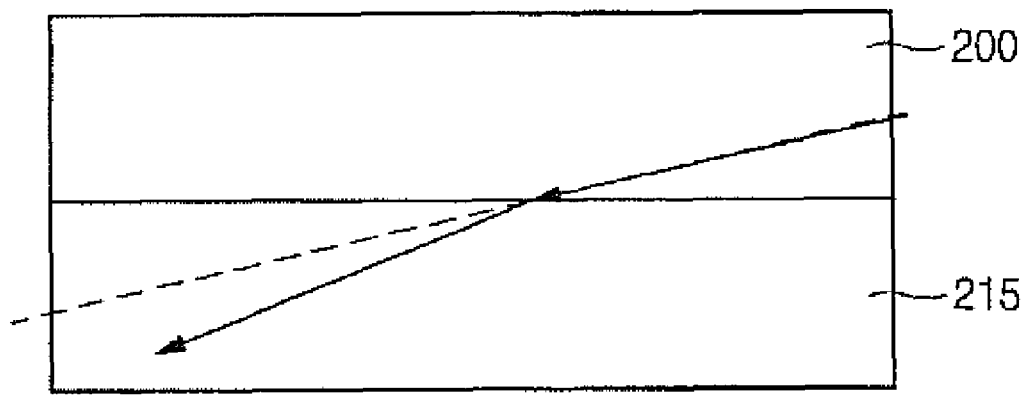

FIGS. 4A and 4B are cross-sectional views showing a difference in light path according to a refractive index of a thin film during an immersion lithography process.

Referring to FIGS. 4A and 4B, the refractive index of a high refractive index fluid 200 is 1.65, the refractive index of a first thin film shown in FIG. 4A is 1.62, and the refractive index of a second thin film shown in FIG. 4B is 1.69.

Accordingly, when light travels from the high refractive index fluid 200 as an immersion portion of an immersion lithography apparatus to the thin film 210 or 215, as the refractive index of the thin film 210 or 215 is increased, the depth of focus (DOF) is increased.

Figure 5:
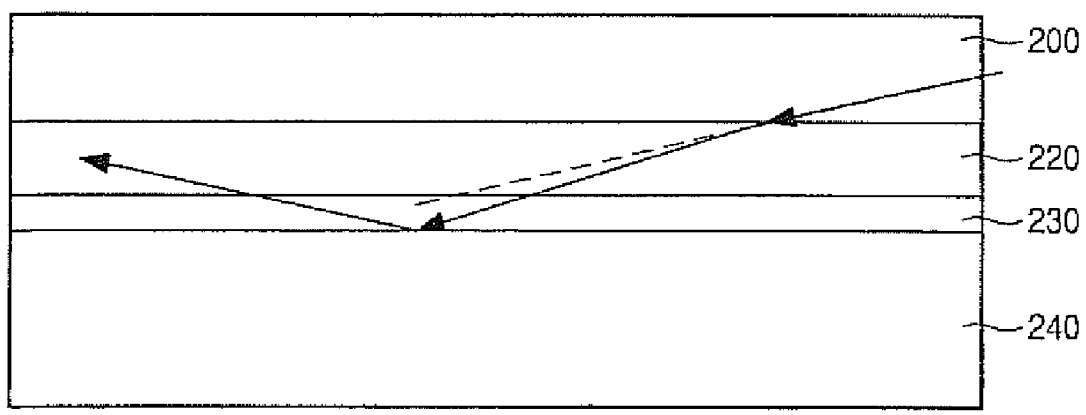
FIG. 5 is a cross-sectional view showing a change in light path according to a difference in refractive index between thin films according to one exemplary embodiment.

FIG. 5 is a cross-sectional view showing a change in light path according to a difference in refractive index between thin films.

Referring to FIG. 5, a hard mask layer 230 is provided on a semiconductor substrate 240, and a photoresist 220 is formed on the hard mask layer 230. Next, the high refractive index fluid 200 as the immersion portion of the immersion lithography apparatus is disposed above the photoresist 220, and then an exposure process is performed.

At this time, the refractive index of the high refractive index fluid 200 is 1.65, the refractive index of each of the photoresist 220 and the hard mask layer 230 is 1.67, and the refractive index of the semiconductor substrate 240 is 1.25. Since the refractive index of each of the photoresist 220 and the hard mask layer 230 is higher than that of the high refractive index fluid 200, the depth of focus (DOF) is increased to some degree. In this case, however, since the refractive index of the semiconductor substrate 240 is low, total internal reflection may occur at the surface of the substrate. Accordingly, efficiency of the lithography process may be degraded. For this reason, there is a need for a method that can increase the refractive index of each of the photoresist 220 and the hard mask layer 230.

According to an embodiment of the invention, there is provided a method that can increase the refractive index by increasing the density of the thin film when the thin film is formed on the semiconductor substrate for the lithography process. When the thin film is formed, if pressure is applied to the thin film or an ultraviolet ray or an electron beam is irradiated onto the thin film, the density of the thin film can be increased, and thus the refractive index can be increased.

If the density of a medium, through which light passes, is increased, the traveling velocity of light is decreased. The relationship between the refractive index and the density of the medium also follows Snell's law:

$n12 = v1/v2 = \sin i/\sin r = d2/d1$

Here, n12 represents a refractive index when light is incident from a primary medium on a secondary medium, v1 and v2 represent velocities of light in the primary medium and the secondary medium, d1 and d2 represent densities of the primary medium and the secondary medium, and i and r represent an incident angle and a reflection angle.

From this expression, it can be seen that, if the densities of the mediums d1 and d2 are increased, the refractive index n12 is also increased.

When the thin film comprises a photochemical thin film, such as an antireflection film, a photoresist, or a top coating material, the thin film is formed on the wafer by a spin coating method, and then pressure is applied during the bake process. At this time, one of nitrogen, helium, argon, and a mixed gas thereof is preferably used.

As the hard mask layer, a thin film containing silicon (Si) and polymer is preferably formed. At this time, any gas can be unlimitedly used to apply pressure.

When the gas is injected into the bake apparatus, the temperature is preferably maintained in the range of about 100° C. to 300° C., and more preferably, in the range of about 170° C. to 220° C. In addition, the pressure is in the range of about 10 psi to 100 psi.

Alternatively, a method that increases the density of the thin film by directly applying pressure to the thin film after the thin film is formed may be used, without performing the pressure-type bake process.

According to the relationship between volume and pressure as discovered by Robert Boyle and Jacques-Alexandre-Cesar, the volume of a predetermined amount of gas is inversely proportionate to the pressure within the experimental error so long as the temperature remains constant.

That is, the product of the pressure and volume of a predetermined amount of gas is constant when the temperature remains constant.

This is called Boyle's law. Boyle's law can be represented in various ways, but it is formally represented by the following equation:

$$PV = \text{Constant}$$

Here, P indicates the pressure of a gas having a predetermined mass when temperature remains constant, and V indicates its volume.

The constant varies the temperature and mass of the gas or the property of the gas. The above equation can be represented as follows:

$$P_1 V_1 = P_2 V_2$$

Here, V1 is the volume of a predetermined amount of gas when the pressure is P1, and V2 is a volume of the gas when the pressure is changed to P2 at the same temperature. When the volume of a gas at a predetermined pressure is given, the volume of the gas at a different pressure can be calculated using Boyle's law.

When the pressure and volume of a predetermined amount of low pressure gas within a closed system are P1 and V1, and the volume is V2 when the pressure is changed to P2 at the same temperature, the following relationship is established:

$$P_1 V_1 = P_2 V_2$$

With respect to a change in volume according to a change in temperature according to Charles's law, in case of a gas, the coefficient of expansion has no relation to temperature and materials at constant pressure, and the volume of the gas increases by 1/273.15 of its volume as temperature rises by 1° C.

If the volume of a gas at 0° C. is V0, and the volume thereof at t° C. is Vt, when the condition P=Constant is satisfied, the following expression is established:

$$V_t = V_0 (1 + 1/273.15 \cdot t) = V_0 (1 + \beta \cdot t)$$

Accordingly, if a temperature in a pressure chamber according to an embodiment of the invention increases, a pressure in the chamber, its volume remaining unchanged, increases. In addition, the pressure in the chamber, which is maintained at a desired pressure by applying constant pressure, is higher than that at normal temperature. Therefore, according to Blaise Pascal's principle, in hydrodynamics (air or liquid), a change in pressure at a point of the stationary fluid in a closed container is transferred to other points of the fluid and the walls of the container with no loss.

The pressure is a value obtained by dividing an applied force by an area, to which the force is applied. In a hydraulic system, the same pressure as pressure that is applied to a piston is applied to a different piston of the system. If the area of the different piston is ten times larger than the area of the piston, the pressure that is applied to the second piston is the same as that of the piston, but the force increases ten times.

This effect can be observed in a hydraulic press and a hydraulic brake according to Pascal's principle. Further, Pascal has found that pressure to be applied at a point of the stationary fluid is the same in all directions. That is, the pressure is the same on all planes, which pass through a predetermined point.

A force that corresponds to the pressure of the pressurized gas is applied to the wafer in the pressure chamber according to the embodiment of the invention.

According to Pascal's principle, the pressure is transferred to the inner wall of the container, but it can be actually seen that the pressure is applied to all objects, including the pressurized fluid. This phenomenon will be apparent through a submarine balloon experiment.

The submarine balloon experiment may be conducted as follows: a large volume of container fills with a fluid (water), and a weight suspends a small balloon at buoyancy such that the balloon stays on the surface of the fluid or in the fluid. Next, if the fluid container is closed, and pressure is applied to the fluid, the applied pressure is transferred to the inner wall of the fluid container by the same force according to Pascal's principle. In this case, however, the pressure is applied to the balloon in the fluid, not the fluid. Accordingly, the balloon is decreased in size and increased in density, and the buoyancy is removed. As a result, the submarine submerges.

If the pressure applied to the fluid is removed, the submarine rises again.

As will be apparent from the foregoing experiment, the pressure of the gas applied to the chamber increases pressure by the same force with respect to the wafer in the chamber, as well as the inner wall of the chamber. If pressure is applied when a spin-coated thin film is dried, the volume of the thin film decreases at the same mass, and its density increases. According to Snell's law, the increased density represents a high refractive index.

As described above, as a method that forms a thin film having an increased density, a pressure-type bake method is easily used. A bake oven for the pressure-type bake method is as follows.

Figure 6:
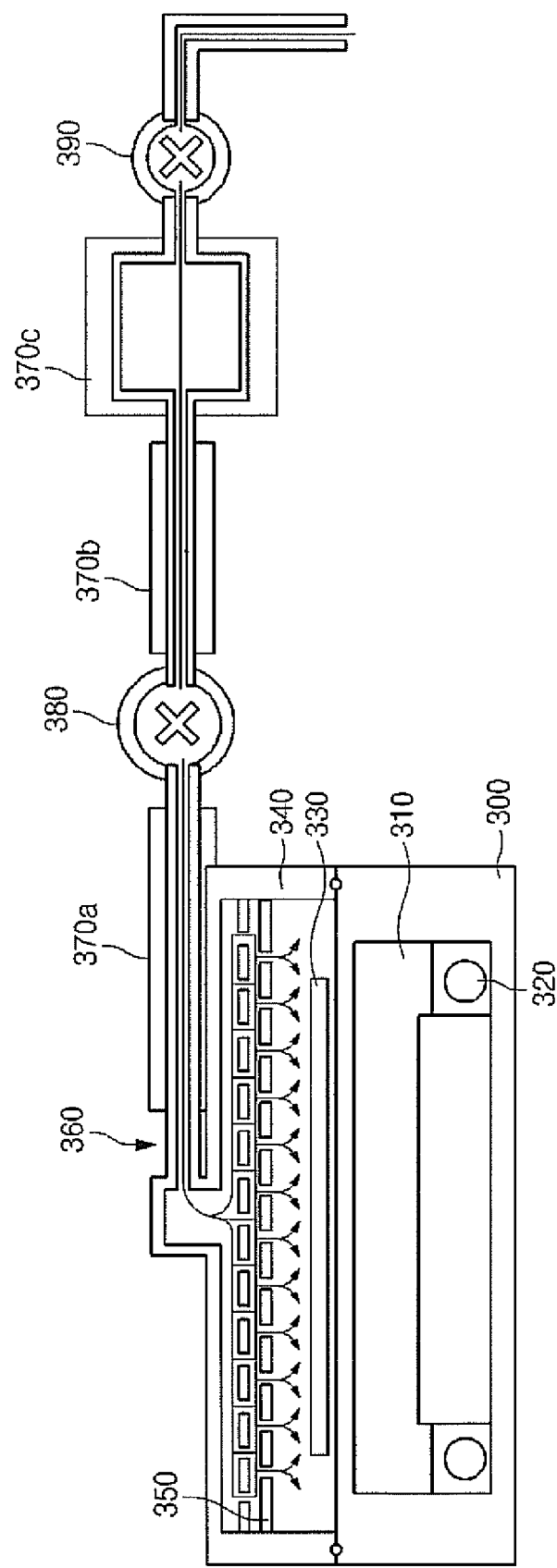
FIG. 6 is a cross-sectional view showing a bake oven according to one exemplary embodiment.

FIG. 6 is a cross-sectional view showing a bake oven according to one embodiment of the invention.

Referring to FIG. 6, an indirect heating-type plate 300 is provided to heat a wafer 330. A heater 310 is provided in the indirect heating-type plate 300, and a heating element 320 is provided in the heater 310, thereby uniformly heating the entire surface of the wafer 330.

Next, a bake oven cover 340 is provided to cover the indirect heating-type plate 300. A gas connection pipe 360 is provided at an upper portion of the cover 340, and gas ejection nozzles 350 are provided inside the upper portion. Accordingly, gas is injected into the bake oven through the connection pipe 360 to increase the pressure in the bake oven, and thus the density of the thin film that is formed on the wafer 330 increases.

To increase the pressure using gas, a primary and a secondary pressure pump 380 and 390 are provided. Between the pressure pumps, temperature control units 370a, 370b and 370c are provided to increase the temperature of the gas or to cool the gas.

First, the indirect heating-type plate 300 is heated ranging from 100 to 300° C., and preferably, ranging from 170 to 220° C., and the pressure in the bake oven is set in the range of about 10 psi to 100 psi using the primary pressure pump 380. At this time, since high pressure is rarely maintained with only the primary pressure pump 380, pressure that is 1.2 to 2.5 times higher than the primary pressure is applied by the secondary pressure pump 390. The temperature control units are used to maintain the same temperature as the bake temperature.

The refractive index of the resultant thin film can be increased ranging from 1.7 to 5, and a fine pattern can be easily formed. In addition, efficiency of the immersion lithography process can be improved.

The embodiment of the invention provides a method that performs a lithography process using a high refractive material to thereby increase the depth of focus (DOF), and a pressure-type bake oven as an apparatus that forms a high refractive material on a semiconductor substrate. Therefore, costs for a semiconductor manufacturing process can be reduced, and efficiency of the lithography process can be improved. As a result, efficiency and reliability in manufacturing a semiconductor device can be improved.

The above embodiments of the invention are illustrative and not limiting. The invention is not limited by the type of deposition, etching polishing, and patterning steps described herein. Nor is the invention limited to any specific type of semiconductor device.

It will be apparent to those skilled in the art that various modifications and variations may be made in the present invention without departing from the spirit and scope consistent with the invention as defined by the appended claims.

What is claimed is:

1. A method of manufacturing a semiconductor device, the method comprising:
    forming a thin film for a mask pattern on a semiconductor substrate;
    applying pressure to the thin film so as to improve the density and refractive index of the thin film; and
    performing a lithography process on the thin film to obtain the mask pattern,
    wherein the pressure is applied by pressurizing a gas into a bake apparatus.

2. The method of claim 1, wherein the thin film comprises a photochemical thin film.

3. The method of claim 1, wherein, when the gas is injected, the temperature is in the range of about 100° C. to 300° C.

4. The method of claim 1 wherein, when the gas is injected, the temperature is in the range of about 170° C. to 220° C.

5. The method of claim 1, wherein the pressurized gas applies a physical force to the thin film.

6. The method of claim 1, wherein the pressure is in the range of about 10 psi to 100 psi.

7. The method of claim 1, wherein the lithography process comprises an immersion lithography process.

\* \* \* \* \*